United States Patent
Fotouhi (12)

(10) Patent No.: US 6,326,820 B1
(45) Date of Patent: Dec. 4, 2001

(54) HIGH-FREQUENCY HIGH-CURRENT LINE DRIVER

(75) Inventor: Bahram Fotouhi, Cupertino, CA (US)

(73) Assignee: Exar Corporation, Fremont, CA (US)

( * ) Notice: Subject to any disclaimer, the term of this patent is extended or adjusted under 35 U.S.C. 154(b) by 0 days.

(21) Appl. No.: 09/568,645

(22) Filed: May 10, 2000

(51) Int. Cl.[7] .................................................. H03B 1/00
(52) U.S. Cl. ........................................ 327/108; 327/111
(58) Field of Search ................................ 327/108, 111, 327/112, 170, 310, 313, 379, 382, 389, 391; 326/26, 27

(56) References Cited

U.S. PATENT DOCUMENTS 6,130,563 * 10/2000 Pilling et al. ......................... 327/111
6,169,432 * 1/2001 Sharpe-Geisher ..................... 327/112

* cited by examiner

Primary Examiner—Timothy P. Callahan
Assistant Examiner—Linh Nguyen
(74) Attorney, Agent, or Firm—Townsend and Townsend and Crew LLP

(57) ABSTRACT

The present invention provides a compensation circuit having a first and a second compensation transistor. The compensation circuit is configured for tying a transconductance, gm, of a first and a second output transistor to a conductance, gds, of the the first and second compensation transistors, respectively, such that a gm-to-gds ratio becomes fixed. The tying stabilizes and prevents movement of the location of the compensation zero. The compensation zero is created by the compensation circuits. The present invention also provides a translinear loop provided by an output and a biasing circuit. The translinear loop includes a first and a second biasing transistor and a first and a second output transistor. The first and second biasing transistors are configured to control the current flow through the first and second output transistors. The biasing circuit also includes a feedback circuit configured for matching the biasing parameters, vgs and vds, of the first and second biasing transistors to those of the first and second output transistors.

9 Claims, 6 Drawing Sheets

HIGH-FREQUENCY HIGH-CURRENT LINE DRIVER

BACKGROUND OF THE INVENTION

The present invention relates generally to the design of integrated circuit products in the semiconductor industry and more particularly to a high-frequency high-current line driver.

High-current line driver circuits should be designed to provide output currents of up to +150 mA or −150 mA. Such circuits should be frequency stable for various load conditions and should operate with minimum stand-by current.

Conventional Line Driver

FIG. 1 shows a conventional high-frequency high-current line driver 100. This is a well-known folded cascode op-amp with a class AB output stage. Its operation is well-known in the art. The op-amp circuit shown has three main stages: a differential input cascode stage 102, an output stage 104, and a biasing stage 106. Two direct current (dc) supplies $V_{DD}$ and $V_{ss}$ can be used to supply these stages, where $V_{ss}$ is represented as a ground source. An input voltage $V_{IN1}$ generates current flow by turning on current sources in the three stages.

Differential input cascode stage 102 drives line driver 100. Input stage 102 includes two main circuits: a differential amplifier 110 and a current mirror 112. Differential amplifier 110 includes transistors 111, 112, and 113. Input stage 102 also includes current source transistors 116, 117, 118, and 119. Current mirror 112 includes transistors 121, 122, 123, and 124. Both circuits 110 and 112 couple together via source transistors 116, 117, 118, and 119.

Generally, differential amplifier 110 controls the current flow through current mirror 112 to provide a high-current to output stage 104. Also, differential amplifier 110 controls the output voltage swing, or switching, of output stage 104. Differential input cascode stages are well-known in the art. Details of structure and operation are further described in below in the detailed description.

Output stage 104 provides the output for line driver 100. Output stage 104 is a push-pull output stage, more specifically, a class AB output stage. Output stage 104 includes transistors 126, 128, 130, and 132, and a source transistor 134. Output stage 104 also includes two compensation circuits. The two compensation circuits provide frequency compensation for output stage 104. The first compensation circuit includes transistor 136 and capacitor 138. The second compensation circuit includes transistor 140 and capacitor 142. This first compensation circuit applies when transistor 130 on. The second compensation circuit applies when transistor 132 is on. Transistors 136 and 140 are the only transistors that are in linear mode (the others are in saturation mode). Transistors 136 and 140 act as resistors connected in series with capacitors 138 and 142, respectively. Class AB output stages are well-known in the art. Details of structure and operation are further described in below in the detailed description.

Under all conditions of an op-amp, or in any feedback configuration, stable operating conditions are desired. A phase shift of 180° resulting in a closed-loop gain of −1 could cause the circuit to oscillate. To avoid this at all times, compensation networks are added to the feedback circuit to modify phase shifts (frequency compensation), or to provide an adequate phase margin.

As is well-known in the art, the movement of the compensation zero, created by the compensation circuits, produces an undesired phase shift at high frequencies. This phase shift is undesired because it degrades frequency and transient responses. Here, as transistors 130 and 132 sink or source output current, the transconductance $g_m$ increases. The transconductance is the derivative of the output current with respect to the input voltage, or $\partial I_{OUT}/\partial V_{IN}$. This increase causes the compensation zero, which is due to the compensation circuit, to shift according to the equation:

$$S_z = \frac{-1}{[1/(g_{ds}) - 1/(g_m)]C} \quad (1)$$

where $g_{ds}$ is the conductance of the compensation switch (transistors 136 and 140), $g_m$ is the transconductance of transistors 130 and 132, and C is the compensation capacitor (capacitors 138 and 142). As the output current varies, the $g_m$ factor typically varies more than the $g_{ds}$ factor does. In the frequency domain, the location of the compensation zero $S_z$ thus moves.

Biasing stage 106 provides dc biasing of the transistors of output stage 104 such as ensuring the appropriate transistors are in saturation mode (not in linear mode). Biasing stage 106 completes a translinear loop 144 and a translinear loop 150, each of which controls current flow through output stage 104. Translinear loop 144 includes transistors 146, 148, 128, and 132. Translinear loop 150 includes transistors 152, 154, 126, and 130. Loops 144 and 150 set the quiescent current in output transistors 132 and 130, respectively.

Biasing stage 106 also includes biasing transistors 156–164. Biasing transistors, such as these, are well-known in the art. Voltages are fed to these transistors, as well as to other transistors of line driver 100, at inputs $V_{IN1}$, $V_{IN2}$, $V_{IN3}$, and $V_{IN4}$. By voltage or current, transistors 156–164 bias other transistors within line driver 100. The transistor sizes and conditions of line driver 100 are predetermined such that all voltages and operating conditions saturate the appropriate transistors. Methods for optimizing such transistor sizes and conditions are well-known in the art. Biasing circuits and translinear loops are well-known in the art. Details of structure and operation are further described in below in the detailed description.

In a high frequency circuit, a short channel length L is necessary for higher speeds. The transistor speed $F_T$ depends on and is inversely proportional to the square of the channel length L. This can be described mathematically by $F_T$ $1/L^2$. Accordingly, output devices should have the shortest channels the process will allow. The Early voltage effect, however, is greater with shorter channel lengths. This impedes the efficiency of the translinear loops.

Mathematically, as described by the equation, $I_{ds}=\frac{1}{2}\beta(v_{gs}-V_T)^2*(1+\lambda v_{ds})$, the current $I_{ds}$ depends on biasing conditions $v_{gs}$ and $v_{ds}$, among other process parameters such as $\beta$, $V_T$, and $\lambda$. The factor $(1+\lambda v_{ds})$ is not ideal because it gives rise to a non-ideal output impedance. Effectively, the factor $(1+\lambda v_{ds})$ impedes the efficiency of the translinear loops. The equation shows that a larger $\lambda$ causes $v_{ds}$ to have a greater effect on the current. The process parameter $\lambda$ depends on and is inversely proportional to the channel length L, i.e., L $1/\lambda$, where the quantity $1/\lambda$ is also referred to as the Early voltage. A shorter channel length L, which is desired, thus correlates to a larger $\lambda$. This effect can be referred to as the $\lambda$ effect or the Early voltage effect. The Early voltage effect principle is well-known in the art. A shorter channel length can thus effect the output transistor current such that it is no longer well controlled by the translinear loop.

For example, referring to translinear loop 144, transistors 148 and 146 30 control the current flow through 128 and 132, ideally. When the drain-to-source voltages $v_{ds}$ of these transistors do not match, due to a variance in the $v_{ds}$ transistor 132 for example, significant current mismatch errors occur. Such a variance in $v_{ds}$ occurs, for example, during quiescent conditions when the output $V_{OUT}$ sits at mid-supply, or $V_{DD}/2$. Specifically, current through transistors 128 and 132 should, but would not, correctly mirror the current through transistors 148 and 146 because of different device ratios. That is, the current (through transistors 128 and 132) would have an extra component due to the $v_{ds}$ differences. As a result of this difference, transistors 146 and 132 would not be matched and transistor 132 would pick up slightly more current than would transistor 146. This is undesirable considering that the device ratios between transistor pairs 146/148 and 132/128 can be on the order of several hundred. Consequently, any current multiplication error can dramatically increase the quiescent output bias current thus increasing quiescent dc power dissipation.

As such, other conditions such as process s, supply condition, and others could change the current by up to 50%. For example, an op-amp designed to draw a current of 2 mA under quiescent conditions could instead draw 3 mA. This is undesired. This increase becomes significant, for example, when a one or two mA increase in current per op-amp occurs in a circuit having 8 op-amps.

Also, during quiescent conditions, when no signal passes through the op-amp, the output $V_{OUT}$ sits at mid-supply. For example, if the supply is at 3V, $V_{OUT}$ is at 1.5V. Thus, the $v_{ds}$ of transistor 132 is at 1.5V. Stated differently, during quiescent conditions, the $v_{ds132}$ would be at $V_{DD}/2$. Because of this imbalance in the translinear loop, transistors 148 and 146 would have less control over the current through transistors 128 and 132.

A need therefore remains for a high-frequency high-current line driver that is frequency stable and that has translinear loops having reliable control over the current flow in the output stage.

SUMMARY OF THE INVENTION

The present invention achieves the above needs and objectives with a new and improved high-frequency high-current line driver circuit. More particularly, the present invention provides an improved frequency compensation circuit and an improved biasing circuit.

In one embodiment, the present invention provides a compensation circuit having a first and a second compensation transistor. The compensation circuit is configured for tying a conductance, gds, of the first and second compensation transistors to a transconductance, gm, of a first and a second output transistor, respectively, such that a gm-to-gds ratio becomes fixed. The tying stabilizes and prevents movement of the location of the compensation zero. The compensation zero is created by the compensation circuit.

In another embodiment, the present invention provides a translinear loop that is provided by an output and a biasing circuit. The translinear loop includes a first 5 and a second biasing transistor and a first and a second output transistor. The first and second biasing transistors are configured to control the current flow through the first and second output transistors. The biasing circuit further includes a feedback circuit configured for matching the biasing parameters, vgs and vds, of the first and second biasing transistors to those of the first and second output transistors.

The present invention achieves the above purposes and benefits in a simple, versatile, and reliable circuit and method that is readily suited to the widest possible utilization. The present invention achieves these purposes and benefits in the context of known circuit technology and known techniques in the electronic arts. Further understanding, however, of the nature, objects, features, and advantages of the present invention is realized by reference to the latter portions of the specification, accompanying drawings, and appended claims. Other objects, features, and advantages of the present invention will become apparent upon consideration of the following detailed description, accompanying drawings, and appended claims.

DESCRIPTION OF THE SPECIFIC EMBODIMENTS

With reference to the drawings, a new and improved high-frequency high-current line driver circuit and method, according to the present invention, will now be described.

Figure 2:
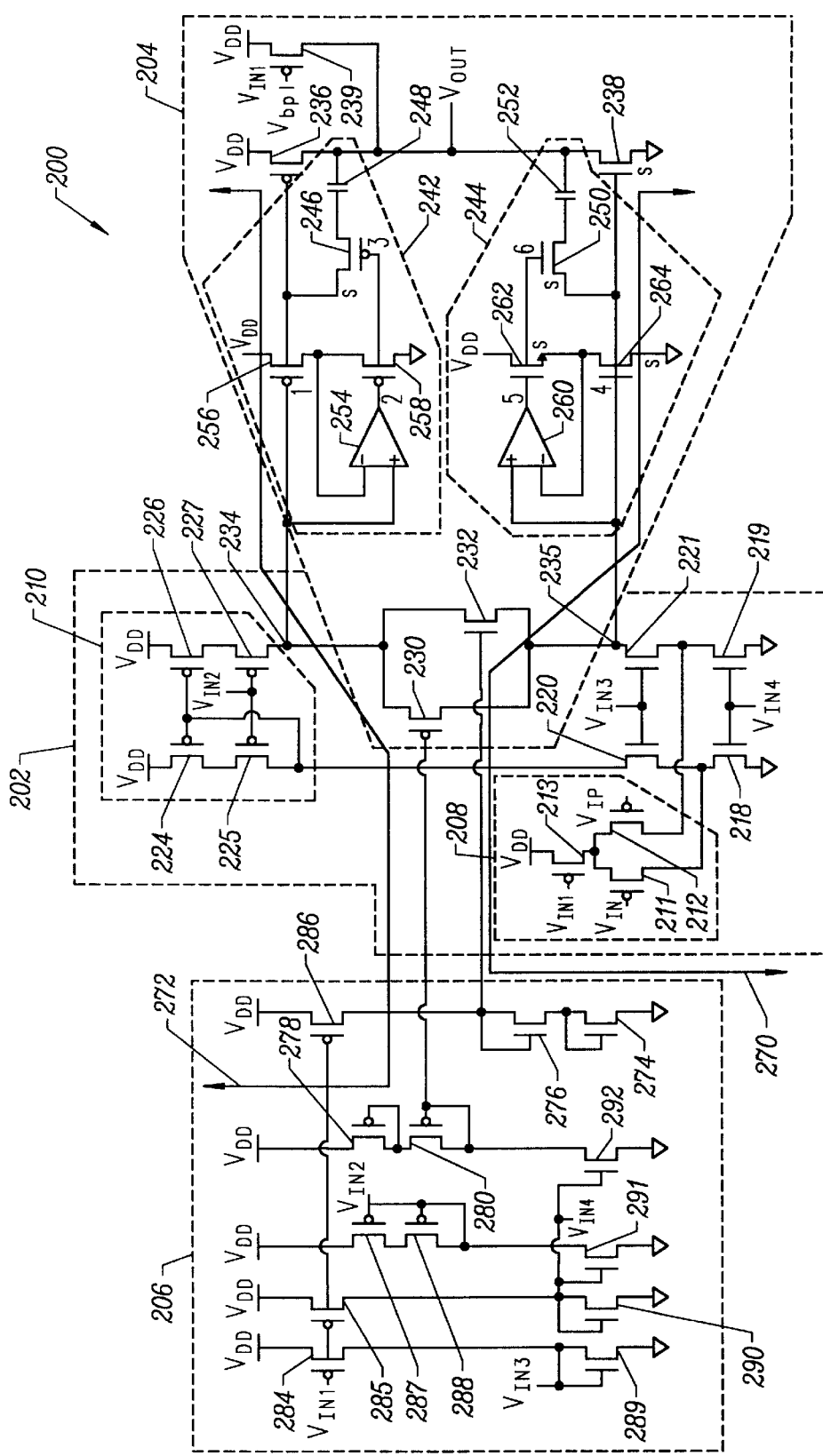
FIG. 2 shows a simplified high-level schematic of a high-frequency high-current line driver according to an embodiment of the present invention.

FIG. 2 shows a simplified high-level schematic of a high-frequency high-current line driver 200 according to an embodiment of the present invention. This schematic is merely an example and should not limit the scope of the claims herein. One of ordinary skill in the art would recognize many other variations, modifications, and alternatives. In a specific embodiment, line driver 200 shown has three main stages: a differential input cascode stage 202, an output stage 204, and a biasing stage 206. Two dc supplies $V_{DD}$ and $V_{ss}$ can be used to supply these stages. In specific embodiments, $V_{ss}$ is represented as a ground source. An input voltage $V_{IN1}$ generates current flow by turning on the current sources in the three stages. By voltage or current, the current sources bias other transistors within line driver 200. The transistor sizes and conditions of line driver 200 are predetermined such that all voltages and operating conditions saturate the appropriate transistors. Methods for optimizing such transistor sizes and conditions are well-known in the art.

Differential Input Cascode Stare

Differential input cascode stage 202 drives line driver 200. Input stage 202 includes two main circuits: a differential amplifier 208 and a current mirror 210. Generally, differential amplifier 208 controls the current flow through current mirror 210 to provide a high-current to output stage 204. Also, differential amplifier 208 controls the output voltage swing, or switching, of output stage 204.

In a specific embodiment, differential amplifier 208 includes two differential transistors 211 and 212, both of which couple to a transistor 213. Transistor 213 provides a current source. A voltage differential at inputs Vin and Vip, the gates of transistors 211 and 212, causes a current differential through these transistors. External sources (not shown) can provide the voltage differential at inputs Vin and Vip. Current sourced from transistor 213 splits between transistors 211 and 212 according to a ratio determined by the voltage differential. The current differential is proportional to the voltage differential. For example, absent a voltage differential, a current amount of 2I through transistor 213 results in equal current amounts of I through transistors 211 and 212. When a voltage differential exists, the current through one of transistors 211 and 212 decreases (I−ΔI), and the current through the other increases (I+ΔI). The polarity of the differential voltage determines which transistor receives the current increase, or decrease.

Input stage 202 also includes two current sources, a transistor 218 and a transistor 219, each having a constant current flow, and transistors 220 and 221, each having a variable current flow. The current amount flowing through transistor 218 is the sum of the currents through transistors 211 and 220. Likewise, the amount of current flowing through transistor 219 is the sum of the currents through transistors 212 and 221. Accordingly, a current decrease −ΔI through transistor 212 causes a current increase +ΔI through transistor 221, and vice versa. Likewise, a current decrease −ΔI through transistor 211 causes a current increase +ΔI through transistor 220, and vice versa.

Current mirror 210 includes transistors 224, 225, 226, and 227, where the current flow through transistors 226 and 227 mirrors the current flow through transistors 224 and 225. For example, if a particular current amount +ΔI flows through transistors 224 and 225, the same current amount +ΔI will flow through transistors 226 and 227. Transistors 226 and 227 are current sources and their current flow remains constant, until the current through transistors 224 and 225 changes.

Differential amplifier 208 couples to current mirror 210 in part by transistors 230 and 232 of output stage 204. Differential amplifier 208 and current mirror 210 cooperate as follows. Following the differential input principle described above, a current increase +ΔI through transistor 220 correlates to a current decrease −ΔI through transistor 221. Recall that the currents through transistors 220 and 221 are inversely proportional. Note that a current can flow to or from transistor 221 because at least one of transistors 230 and 232 is on at all times. Also note that the voltages at nodes 234 and 235 track each other for this reason. The significance and operational details of transistors 230 and 232 are described below in the discussion of the output stage. Following the principle of current mirror 210 described above, the current increase +ΔI through transistor 220 causes a current increase +ΔI of the same amount through transistor 225. Accordingly, a current decrease −ΔI through transistor 221, or from node 235, and a current increase +ΔI through transistor 227, or to node 234, causes a current increase of +2ΔI to output stage 204 (current is sourced, or "pushed," to the output stage). Conversely, following the same logic, a current decrease −ΔI through transistor 220 correlates to a current decrease of −2ΔI from output stage 204 (current sinks, or is "pulled," from the output stage).

Output Stage

Output stage 204 provides the output for line driver 200. Output stage 204 is a push-pull output stage, more specifically, a class AB output stage. Class AB output stages are well-known in the art. In a specific embodiment, output stage 204 includes transistors 230, 232, 236, and 238, and a current source transistor 239. Output stage 204 also includes compensation circuits 242 and 244.

Input stage 202 also drives the switching of output stage 204. Specifically, during a negative swing at output $V_{OUT}$, a current increase at node 234 (as described above) increases, or amplifies, the voltage at node 234 (and at node 235, due to the tracking of these nodes, described above). Stated differently, if current is sourced to the output stage, the voltage increases at nodes 234 and 235, or at the gates of transistors 236 and 238. Accordingly, transistor 236 turns off and transistor 238 turns on. During a positive swing at output $V_{OUT}$, the reverse occurs. A voltage drop at the gates of transistors 236 and 238 turns transistor 236 on and transistor 238 off.

As stated above, at least one of transistors 230 and 232 is on at all times, i.e., when transistor 230 is on, transistor 232 is off, and vice versa. Specifically, transistors 230 and 232 operate as follows. Bias circuit 206 (described in more detail below) provides a fixed voltage to the gates of transistor 230 and 232. The voltage at nodes 234 and 235 moves up and down, and thus controls the on-off states of transistors 230 and 232 by controlling the gate-to-source voltages of each. For example, a voltage increase at nodes 234 and 235 increases the gate-to-source voltage, or vgs, of transistor 230 which turns it on, and decreases the vgs of transistor 232 which turns it off. A voltage decrease causes the opposite result, i.e., transistor 230 turns off and transistor 232 turns on.

Compensation Circuit (part of the output stage)

Compensation circuits 242 and 244 provide frequency compensation for output stage 204. Compensation circuits 242 includes a transistor 246 and a capacitor 30 248, and applies when transistor 236 on. Compensation circuit 244 includes a transistor 250 and a capacitor 252, and applies when transistor 238 is on. Transistors 246 and 250 are the only transistors that are in linear mode. The other transistors are in saturation mode. Transistors 246 and 250 act as resistors connected in series with capacitors 248 and 252, respectively. These specific portions of the compensation circuits are well-known in the art.

In a specific embodiment, compensation circuit 242 also includes an op-amp 254 and two transistors 256 and 258. A non-inverting input of op-amp 254 couples to node 234 and to the gates of transistors 256 and 236, and to the source of transistor 246. An inverting input of op-amp 254 couples to the drain of transistor 256 and to the source of transistor 258. An output of op-amp 254 couples to the gates of transistors 258 and 246. The drain of transistor 246 couples to the drain of transistor 236 via capacitor 248. The source of transistor 256 couples to a $V_{DD}$ source and the drain of transistor 258 couples to a ground source.

In a specific embodiment, compensation circuit 244 also includes an op-amp 260 and two transistors 262 and 264. A non-inverting input of op-amp 260 couples to node 235 and to the gates of transistors 264 and 238, and to the source of transistor 250. An inverting input of op-amp 260 couples to the source of transistor 262 and to the drain of transistor 264. An output of op-amp 260 couples to the gates of transistors 262 and 250. The drain of transistor 250 couples to the drain of transistor 238 via capacitor 252. The drain of transistor 262 couples to a $V_{DD}$ source and the source of transistor 264 couples to ground.

Compensation circuits 242 and 244 of the present invention stabilize the location of compensation zero with output voltage swing. The compensation networks, or circuits, modifying the phase shift to provide enough phase margin and thus prevent oscillation at all times. For example, a 180° phase shift creates an unstable environment. This is not desired. The invention increases the phase margin and thus avoids a 180° phase shift. The phase margin is the distance, or number of degrees, away from the 180° phase shift. For example, a phase margin of zero correlates to a 180° phase shift. Also, a 60° phase margin is 60° away from a 180° phase shift. A second pole is created by all of the output node parasitics, which are more or less fixed. For example, if the load capacitance if fixed, then that pole is fixed. The phase margin, however, changes if the zero moves back and forth. The phase margin changes enough, it can be lost, i.e., go to zero. This could result in the unstable environment described above. The present invention prevents the movement of the zero and thus maintains the phase margin.

In specific embodiments, the present invention employs internal frequency compensation circuits to prevent oscillation. Other methods of frequency compensation can be used such as external frequency compensation circuits, etc. Generally, the present invention fixes the location of the zero by tying the $g_m$ and $g_{ds}$ to the geometric ratios of the devices. As such, any variance in signal or supply conditions would not shift the zero. According the present invention, the following equations generally apply.

$I_{linear}=\beta[(v_{gs}-V_T)v_{ds}-\frac{1}{2}v_{ds}^2]g_{ds}=\partial I/\partial v_{ds}(g_{ds}$ usually applies to linear equations)

$I_{saturated}=\frac{1}{2}\beta(v_{gs}-V_T)^2 g_m=\partial I/\partial v_{gs}(g_m$ usually applies to saturation equations)

Specifically, the following equations apply. Note that while these equations refer to compensation circuit 244, corresponding equations would equally apply to compensation circuit 242.

$$I_{238}=\tfrac{1}{2}\beta_{238}(v_{gs238}-V_T)^2 \quad (2)$$

$$I_{262}=\tfrac{1}{2}\beta_{262}(v_{gs262}-V_T)^2 \quad (3)$$

$$I_{264}=\tfrac{1}{2}\beta_{264}(v_{gs264}-V_T)^2 \quad (4)$$

$$v_{gs238}=v_{gs264} \quad (5)$$

$$I_{262}=I_{264} \quad (6)$$

$$g_{ds250}=\beta_{250}(v_{gs250}-V_T) \quad (7)$$

$$g_{m238}=\beta_{238}(v_{gs238}-V_T) \quad (8)$$

Note that $g_{ds250}=\beta_{250}(v_{gs250}-V_{T250})+v_{ds250}$. When no dc current exists, however, i.e., $v_{ds250}=0$, the $g_{ds}$ component becomes a function of $v_{gs250}$ such that $g_{ds250}=\beta_{250}(v_{gs250}-V_{T250})$. The compensation zero is set at infinite frequency for $$g_{ds250}=g_{m238} \quad (9)$$

Using Equations (2)–(9), $\beta_{250}=\beta_{238}(\beta_{262}/\beta_{264})^{1/2}$. Therefore, the zero is set at infinite frequency independent of output currents through geometric ratios of the devices.

Still referring to FIG. 2, compensation circuit 244 is configured to bias the $v_{gs}$ of transistor 250 to approximately equal the $v_{gs}$ of transistor 238. Specifically, the $v_{gs}$ of transistor 250 is biased by op-amp 260, which mimics a battery having an output value that is the same as the $v_{gs}$ of transistor 238. Op-amp 260 is a high-gain amplifier so the voltage potentials at its inputs are forced to be equal. Op-amp 260 thus forces the source potentials at transistors 262 and 250, the drain potential of transistor 264, and the gate potentials of transistors 264 and 238 to equal the voltage potential at node 235. Op-amp 260 also sets, or fixes, the gate potentials of transistors 262 and 250 such that the gate-to-source voltages, or $v_{gs}$, of transistors 262 and 250 are identical. The $v_{gs}$ of transistors 262 and 264 are approximately equal to the $v_{gs}$ of transistor 238. This is because $v_{gs}$ depends on the current densities, and transistors 262 and 264 are manufactured to have the same current densities as transistor 238. Thus, the $v_{gs250}$ equals $v_{gs262}$, and $v_{gs250}$ approximately equals $v_{gs238}$.

More specifically, the channel width-to-length (W/L) ratios of transistors 262 and 264 are configured such that their current densities are the same with respect to transistor 238. For example, if have 1 mA at transistor 238 and the W/L ratios of transistors 262 and 264 are such that they are 10 times smaller than that of transistor 238. The current through transistors 262 and 264 would be only 100 uA. Thus, for the same $v_{gs}$, their current could be much different. Note that the body effect of transistor 262 canceled by that of transistor 250.

Accordingly, as 235 moves up, the gates and sources of transistors 262 and 250 also move up. This fixes the $v_{gs}$ of these transistors. Also, a change in the $g_m$ of transistor 238 impresses a change in the $g_{ds}$ of transistor 250 via op-amp 260. This prevents the location of the zero from shifting.

Likewise, compensation circuit 242 is configured to bias the $v_{gs}$ of transistor 246 to approximately equal the $v_{gs}$ of transistor 236. Specifically, the $v_{gs}$ of transistor 246 is biased by op-amp 254, which mimics a battery having an output value that is the same as the $v_{gs}$ of transistor 236. Accordingly, following the same logic used to describe compensation circuit 244, above, as 234 moves up, the gates and sources of transistors 258 and 246 also move up. This fixes the $v_{gs}$ of these transistors. Also, a change in the $g_m$ of transistor 236 impresses a change in the $g_{ds}$ of transistor 246 via op-amp 254. This prevents the location of the zero from shifting.

Biasing Stage

Biasing stage 206 is configured to provide dc biasing of the transistors of line driver 200 such as ensuring that the appropriate transistors are in saturation mode (not in linear mode). Biasing stage 206 is configured to complete a translinear loop 270 and a translinear loop 272, each of which control current flow through output stage 204. Translinear loop 270 includes transistors 274, 276, 232, and 238. Translinear loop 272 includes transistors 278, 280, 230, and 236. Loops 270 and 272 are configured to set the quiescent current in output transistors 238 and 236, respectively.

In a specific embodiment, biasing stage 206 also includes biasing transistors 284–292. Biasing transistors such as these are well-known in the art. Voltages are fed to transistors 284–292, as well as to other transistors of line driver 200, at inputs $V_{IN1}$, $V_{IN2}$, $V_{IN3}$, and $V_{IN4}$. By voltage or current, transistors 284–292 bias other transistors within line driver 200. The transistor sizes and conditions of line driver 200 are predetermined such that all voltages and operating conditions saturate the appropriate transistors. Methods for optimizing such transistor sizes and conditions are well-known in the art. Biasing circuits and translinear loops are well-known in the art.

Figure 3:
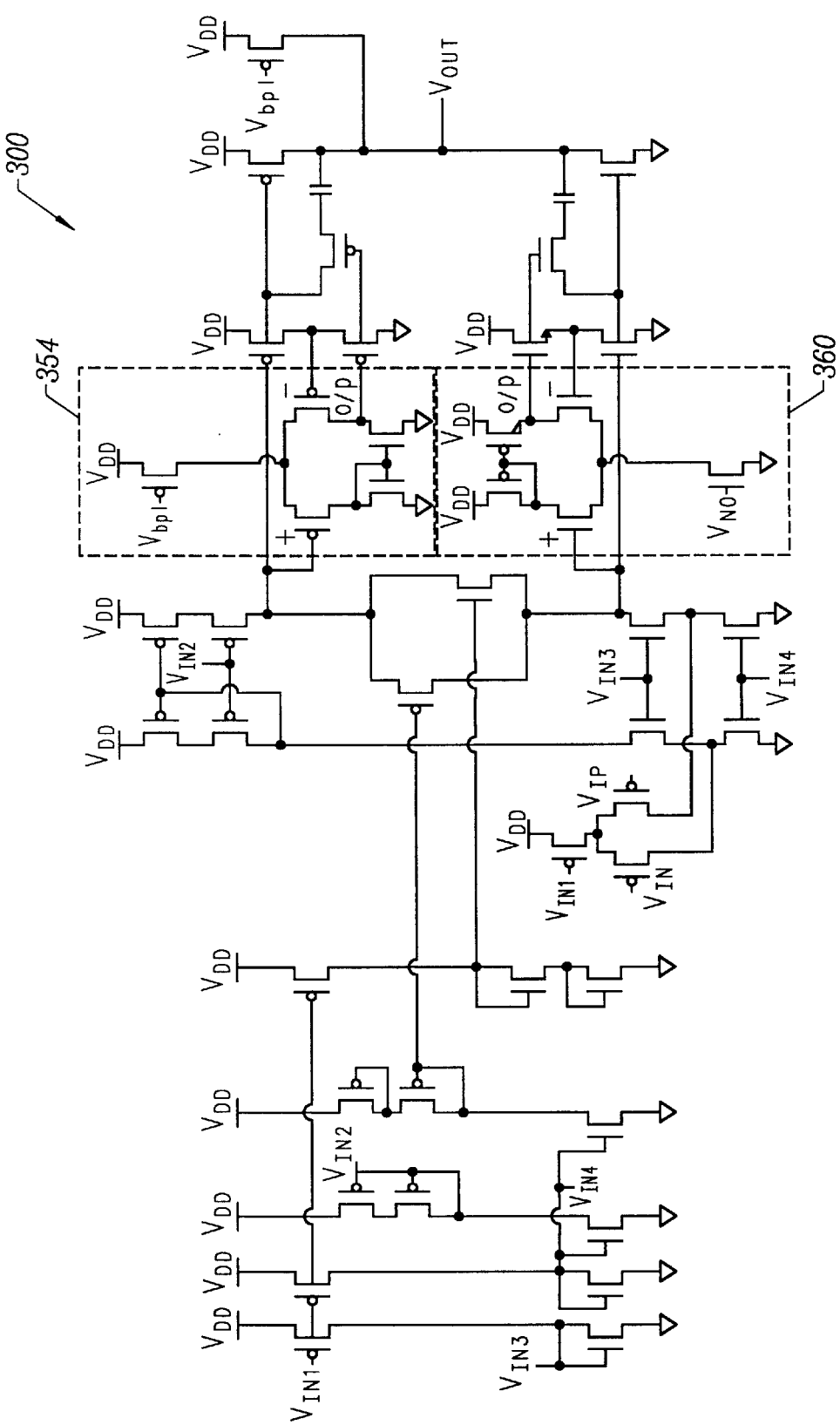
FIG. 3 shows a simplified high-level schematic of a high-frequency high-current line driver according to another embodiment of the present invention.

FIG. 3 shows a simplified high-level schematic of a high-frequency high-current line driver 300 according to another embodiment of the present invention. This schematic is merely an example and should not limit the scope of the claims herein. One of ordinary skill in the art would recognize many other variations, modifications, and alternatives. This specific embodiment operates similarly to that of FIG. 2. In a specific embodiment, FIG. 3 shows op-amps 354 and 360 of the output circuit in more detail. The specific op-amp configurations of course can be implemented numerous ways according to the present invention.

Figure 4:
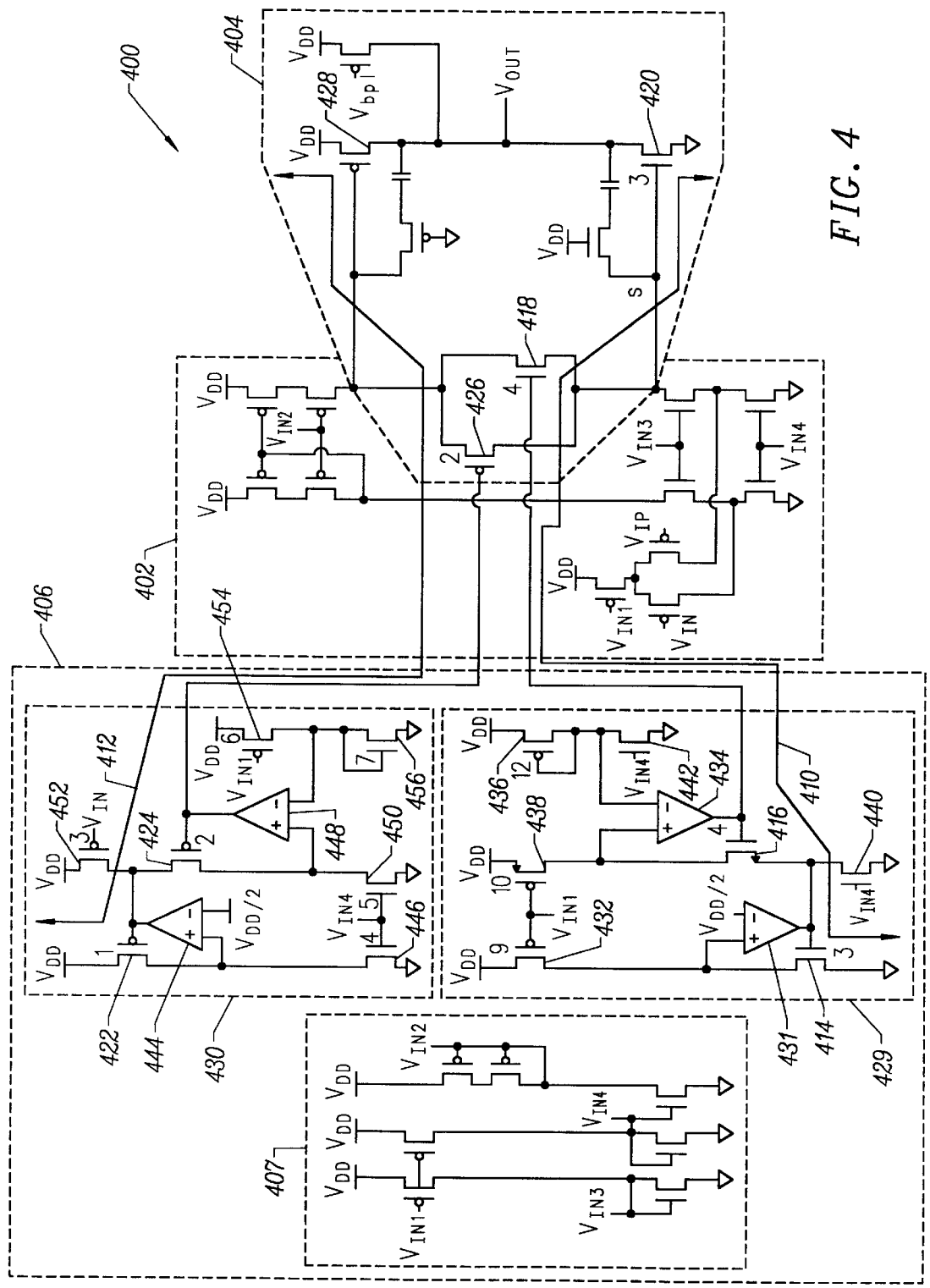
FIG. 4 shows a simplified high-level schematic of a high-frequency high-current line driver according to another embodiment of the present invention.

FIG. 4 shows a simplified high-level schematic of a high-frequency high-current line driver 400 according to another embodiment of the present invention. This schematic is merely an example and should not limit the scope of the claims herein. One of ordinary skill in the art would recognize many other variations, modifications, and alternatives. In a specific embodiment, line driver 400 shown has three main stages: a differential input cascode stage 402, an output stage 404, and a biasing stage 406. Two dc supplies $V_{DD}$ and $V_{ss}$ can be used to supply these stages. In specific embodiments, $V_{ss}$ is represented as a ground source. An input voltage $V_{IN1}$ generates current flow by turning on the current sources in the three stages.

Figure 1:
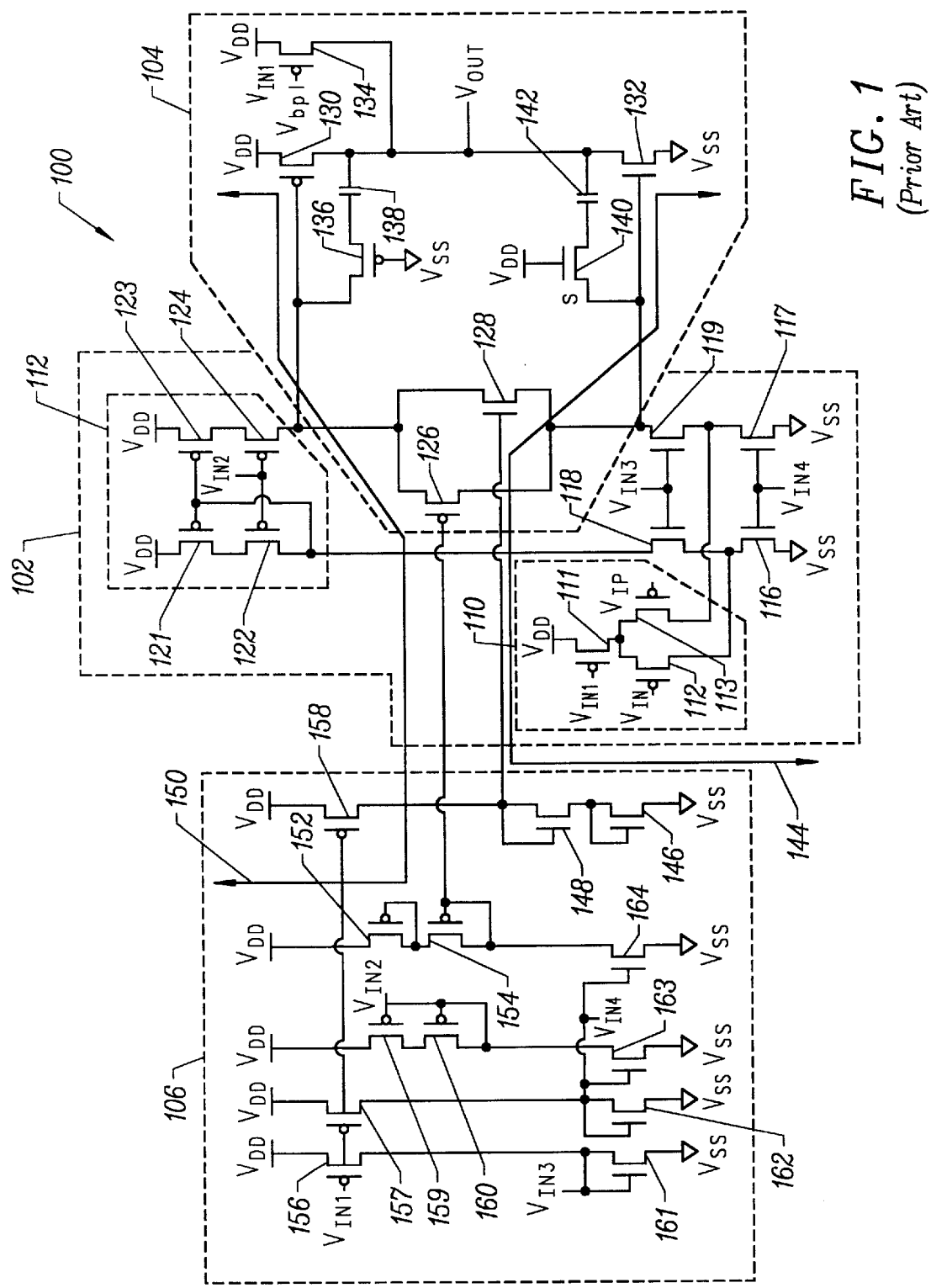
FIG. 1 shows a conventional high-frequency high-current line driver.

Input stage 402 drives line driver 400 and operates in a similar manner to that of input stage 202 of FIG. 2. Output stage 404 provides the output for line driver 400 and operates in a similar manner to that of output stage 204 of FIG. 2. The two compensation circuits provide frequency compensation for output stage 404 and operate in a similar manner to that of the compensation circuits of FIG. 1.

Biasing stage 406 is configured to provide dc biasing of the transistors of output stage 404 such as ensuring that the appropriate transistors are in saturation mode (not in linear mode). Biasing stage 406 also includes biasing circuit 407. Biasing circuits such as circuit 407 are well-known in the art. Voltages are fed to circuit 407, as well as other circuits of line driver 400, at inputs $V_{IN1}$, $V_{IN2}$, $V_{IN3}$, and $V_{IN4}$. By voltage or current, circuit 407 biases other transistors within line driver 400. The transistor sizes and conditions of line driver 400 are predetermined such that all voltages and operating conditions saturate the appropriate transistors. Methods for optimizing such transistor sizes and conditions are well-known in the art. Biasing circuits and translinear loops are well-known in the art.

Biasing stage 406 is configured to complete a translinear loop 410 and a translinear loop 412, each of which control current flow through output stage 404. Translinear loop 410 includes transistors 414, 416, 418, and 420. Translinear loop 412 includes transistors 422, 424, 426, and 428. Loops 410 and 412 are configured to set the quiescent current in output transistors 420 and 428, respectively.

Translinear loop 410 moves up from ground two diode drops ($v_{gs414}+v_{gs416}$) then moves down back to ground two diode drops ($v_{gs418}+v_{gs420}$) to close the loop. Transistors 414 and 416 behave like a battery and provide a fixed voltage bias to output stage 404. Specifically, this fixed voltage bias provides a fixed common gate for transistors 426 and 418 allowing them to switch on and off, as described above. The current through transistors 416 and 414 of the loop indirectly controls the current through transistors 418 and 420.

Loop 410 transistors are fabricated to have matched characteristics, i.e., the size ratio of transistors 416 and 414 is equal to that of transistors 418 and 420. For example, if the sizes of transistors 416 and 418 are equal, and sizes of 414 and 420 are equal, the current through transistors 416 and 414 would equal the current through transistors 418 and 420. Also, if the sizes of transistors 418 and 420 were ten times the sizes of transistors 416 and 414, the current through transistors 418 and 420 would be ten times more that the current through transistors 416 and 414. Note that both transistors 416 and 418 have identical body effects and their $V_{gs}$ will match each other.

Translinear loop 412 moves down from VDD two diode drops ($v_{gs422}+v_{gs424}$) then moves up back to $V_{DD}$ two diode drops ($v_{gs426}+v_{gs429}$) to close the loop. Transistors 422 and 424 behave like a battery and provide a fixed voltage bias to output stage 404. Loop 412 transistors are also fabricated to have matched characteristics. The size ratio of transistors 422 and 424 equals that of transistors 428 and 426. Similar to loop 410, the current through transistors 422 and 424 of the loop indirectly controls the current through transistors 428 and 426.

Biasing stage 406 is configured to allow the translinear loops to properly control the current through transistors 428 and 426 of output stage 404. According to the invention, the translinear loops maintain proper control even when no signal is present. Specifically, biasing stage 406 includes high-voltage gain feedback circuits 429 and 430. Feedback circuits 429 and 430 are applied to transistor pairs 416/414 and 422/424, respectively. Details of feedback circuits 429 and 430 are provided below.

As described by the equation, $I_{ds}=\frac{1}{2}\beta(v_{gs}-V_T)^2(1+\lambda v_{ds})$, the current depends on biasing conditions $v_{gs}$ and $v_{ds}$, among other process parameters such as $\beta$, $\lambda$, and $V_T$. The factor $(1+\lambda v_{ds})$ is not ideal because it gives rise to a non-ideal output impedance. Effectively, the factor $(1+\lambda v_{ds})$ diminishes control of the translinear loop in setting the output current. The biasing stage according to the present invention circumvents the factor $(1+\lambda v_{ds})$.

In a high frequency circuit, a short channel length L is necessary for faster transistors, thus higher speeds. Stated differently, the transistor speed $F_T$ depends inversely on the square of the channel length L. This can be described mathematically by $F_T \partial 1/L^2$. If, for example, L is reduced by ½, $F_T$ goes up 4X. Specifically, a shorter L reduces the gate capacitance. Accordingly, output devices should have the shortest channels the process will allow. In a specific embodiment, the channel length L is 0.6 um. If 0.6 um is used, however, the $\lambda$ effect is greater. The output transistor current will no longer be well controlled through the translinear loop.

The process parameter $\lambda$ depends on and is inversely proportional to the channel length L. Accordingly, a shorter channel length L, correlates to a larger $\lambda$, i.e., $L \partial 1/\lambda$, where the quantity $1/\lambda$ is also referred to as the Early voltage. A shorter L correlates to a larger $\lambda$, which causes $v_{ds}$ to have a greater effect on the current. This effect can be referred to as the $\lambda$ effect or the Early voltage effect. From another perspective on the Early effect, a transistor behaves more like a resistor. The transistor's output impedance is drastically reduced with a shorter L.

For this reason, a longer L appears to be more desirable. For example, a longer L reduces the $\lambda$ effect, thus reducing the effect of $v_{dss}$ on the current. The current difference induced by $v_{ds}$ will not be substantial. A difference of 0.5% up to 2% is negligible. Conversely, a shorter L creates a substantial difference of up to twice, or 2×, the current amount.

Biasing circuit 406 of the present invention is configured to fix $v_{ds}$, and to control $v_{gs}$ by controlling the current densities through particular transistors. In specific embodiments, according to the present invention, high-voltage gain feedback circuits 429 and 430 are configured such that translinear loops 410 and 412 of line driver 400 are properly matched. Referring to loop 410, the biasing parameters, $v_{gs}$ and $v_{ds}$, of transistor 414 and 416 match, or mimic, those of transistors 420 and 418, respectively. Also, referring to loop 412, the biasing parameters, $v_{gs}$ and $v_{ds}$, of transistors 422 and 424 match, or mimic, those of transistors 428 and 426, respectively. By eliminating the $v_{ds}$ variations, the problems associated with the Early voltage effect is minimized, if not eliminated.

Transistors 414–420

During quiescent conditions, the drain of transistor 420 is biased at $V_{DD}/2$. The source of transistor 420 is biased at ground. The $v_{ds}$ of transistor 420 is thus $V_{DD}/2$. The gate potential of transistor 420 is one diode drop above ground. The $v_{gs}$ of transistor 420 is thus one diode drop above ground. Likewise, the drain of transistor 414 is biased at $V_{DD}/2$, because op-amp 431 forces a voltage of $V_{DD}/2$ at the drain of transistor 414. Specifically, op-amp 431 has one input biased at the drain of transistor 414 and the other input biased at $V_{DD}/2$. The $V_{DD}/2$ bias can be set by an external circuit such as a resistor or transistor divider, or other divider. The source of transistor 414 is biased at ground. The $v_{ds}$ of transistor 414 is thus $V_{DD}/2$. Op-amp 431 biases the gate of transistor 414 at the proper bias point such that the $v_{gs}$ bias of transistor 414 mimics that of transistor 420. The biasing parameters $v_{ds}$ and $v_{gs}$ of transistor 414 thus mimic those of transistor 420. Note that during quiescent conditions, the gate nodes of transistors 428 and 420 would not change.

Transistors 416–418

The drain of transistor 418 is biased at gate of transistor 428 and is thus biased at one diode drop ($v_{gs428}$) below $V_{DD}$. The source of transistor 418 is biased at the gate of transistor 420 and is thus biased at one diode drop ($v_{gs420}$) above ground. Likewise, the drain of transistor 416 is biased at one diode drop below $V_{DD}$. Specifically, Op-amp 434 biases the drain of transistor 416 at the gate of transistor 436 such that the drain of transistor 416 is biased at one diode drop ($v_{gs436}$) below $V_{DD}$. Transistor 436 has a source coupled to $V_{DD}$, and a drain and a gate coupled together. The source of transistor 416 is biased at one diode drop ($v_{gs414}$) above ground, because op-amp 431 biases the source of transistor 416 at the gate of transistor 414. Op-amp 434 biases the gate of transistor 416 at the proper bias point such that the $v_{gs}$ bias of transistor 416 mimics that of transistor 418. The biasing parameters $v_{ds}$ and $v_{gs}$ of transistor 416 thus mimic those of transistor 418.

Bias stage 406 also includes biasing transistors 432, 438, 440, and 442. Transistor 432 has a source coupled to $V_{DD}$, a drain coupled to the drain of transistor 414, and a gate coupled to $V_{IN1}$ and to the gate of transistor 438. Transistor 438 has a source coupled to a $V_{DD}$ source, and a drain coupled to the drain of transistor 416. Transistor 440 has a drain coupled to the source of transistor 416, a source coupled to ground, and a gate coupled to $V_{IN4}$. Transistor 442 has a drain coupled to the drain and gate of transistor 436, a source coupled to ground, and a gate coupled to $V_{IN4}$. Biasing transistors such as these and their uses are well-known in the art.

Transistors 422–428

Transistors 422 and 428 behave similarly to transistors 414 and 420. During quiescent conditions, the drain of transistor 428 is biased at $V_{DD}/2$. The source of transistor 428 is biased at $V_{DD}$. The $v_{ds}$ of transistor 428 is thus $V_{DD}/2$. The gate potential of transistor 428 is one diode drop below $V_{DD}$. The $v_{gs}$ of transistor 428 is thus one diode drop below $V_{DD}$. Likewise, the drain of transistor 422 is biased at $V_{DD}/2$, because op-amp 444 forces a voltage of $V_{DD}/2$ at the drain of transistor 422. Specifically, op-amp 444 has one input biased at the drain of transistor 422 and the other input biased at $V_{DD}/2$. The $V_{DD}/2$ bias can be set by an external circuit such as a resistor or transistor divider, or other divider. The source of transistor 422 is biased at $V_{DD}$. The $v_{ds}$ of transistor 422 is thus $V_{DD}/2$. Op-amp 444 biases the gate of transistor 422 at the proper bias point such that the $v_{gs}$ bias of transistor 422 mimics that of transistor 428. The biasing parameters $v_{ds}$ and $v_{gs}$ of transistor 422 thus mimic those of transistor 428.

Transistors 424–426

Transistors 424 and 426 behave similarly to transistors 416 and 418. The drain of transistor 426 is biased at gate of transistor 428 and is thus biased at one diode drop ($v_{gs428}$) below $V_{DD}$. The source of transistor 426 is biased at the gate of the transistor 420 and is thus biased at one diode drop ($v_{gs420}$) above ground. Likewise, the drain of transistor 424 is biased at one diode drop above ground. Specifically, Op-amp 448 biases the drain of transistor 424 at the gate of transistor 450 such that the drain of transistor 424 is biased at one diode drop ($v_{gs450}$) above ground. Transistor 450 has a drain and a gate coupled together and a source coupled to ground. The source of transistor 424 is biased at one diode drop ($v_{gs422}$) below $V_{DD}$. Op-amp 448 also biases the gate of transistor 424 at the proper bias point such that the $v_{gs}$ bias of transistor 424 mimics that of transistor 426. The biasing parameters $v_{ds}$ and $v_{gs}$ of transistor 424 thus mimic those of transistor 426.

Bias stage 406 also includes biasing transistors 446, 450, 452, and 454. Transistor 446 has a drain coupled to the drain of transistor 422, a source coupled to ground, and a gate coupled to $V_{IN4}$ and to the gate of transistor 450. Transistor 450 has a drain coupled to the drain of transistor 424, and a source coupled to ground. Transistor 452 has a source coupled to $V_{DD}$, and a drain coupled to the source of transistor 424, and a gate coupled to $V_{IN1}$. Transistor 454 has a source coupled to $V_{DD}$, a drain coupled to the drain and gate of transistor 450, and a gate coupled to $V_{IN1}$. Biasing transistors such as these and their uses are well-known in the art.

As a result, applying a high-voltage gain feedback around transistors 414 and 416, and applying a high-voltage gain feedback around transistors 422 and 424, reduces the current variation due to the Early voltage effect. This achieves faster switching of the output transistors and thus a wide bandwidth. Returning to the example above where L is reduced by ½ and $F_T$ goes up 4×, a bandwidth of 25 MHz is thus increased to 100 MHz.

Figure 5:
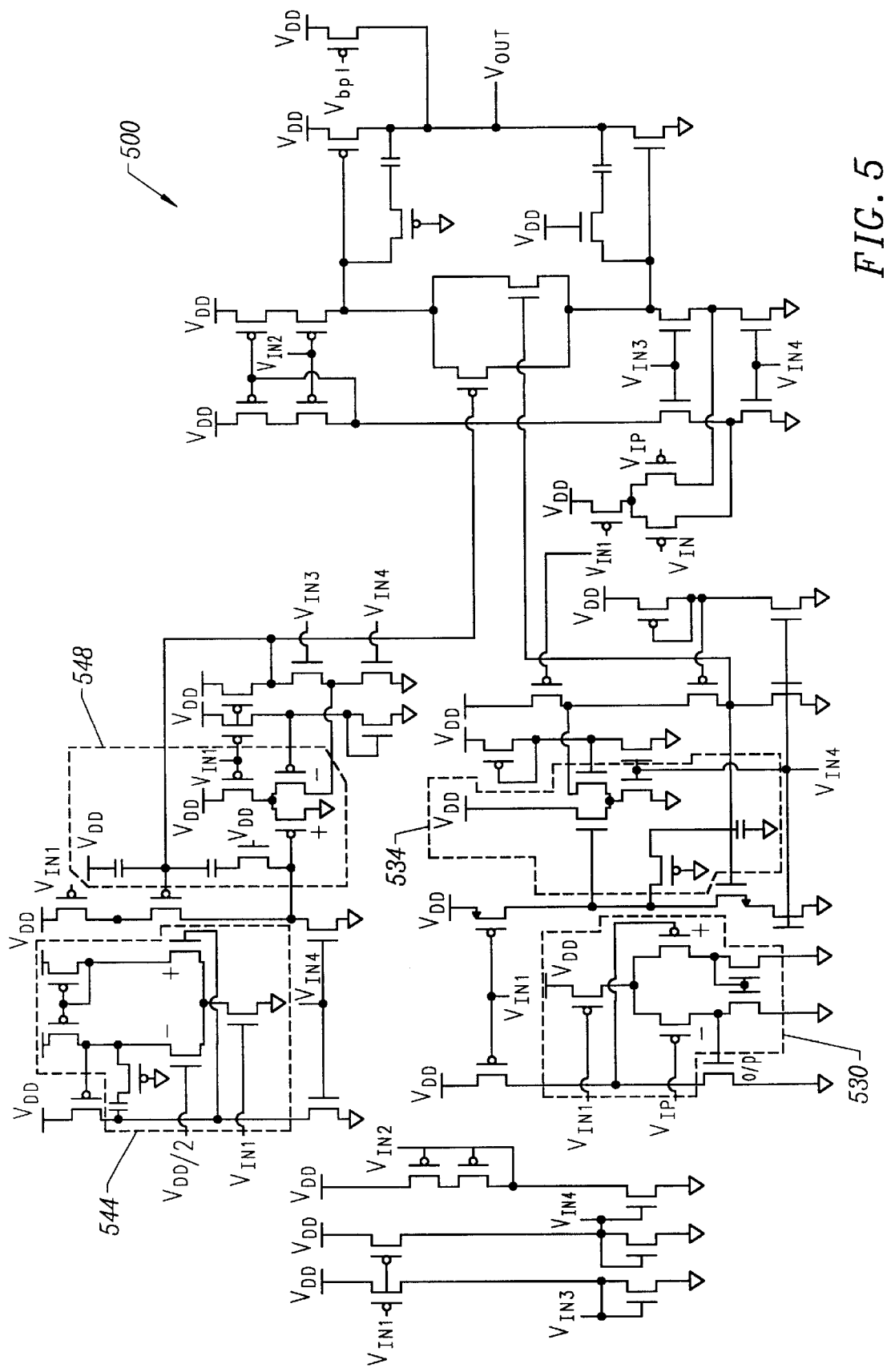
FIG. 5 shows a simplified high-level schematic of a high-frequency high-current line driver according to another embodiment of the present invention.

FIG. 5 shows a simplified high-level schematic of a high-frequency high-current line driver 500 according to another embodiment of the present invention. This schematic is merely an example and should not limit the scope of the claims herein. One of ordinary skill in the art would recognize many other variations, modifications, and alternatives. This specific embodiment operates similarly to that of FIG. 4. The op-amps of the biasing circuit of FIG. 5 are shown in more detail. In a specific embodiment, FIG. 5 shows op-amps 530, 534, 548, and 544 of the biasing circuit in more detail. The specific op-amp configurations of course can be implemented numerous ways according to the present invention.

Figure 6:
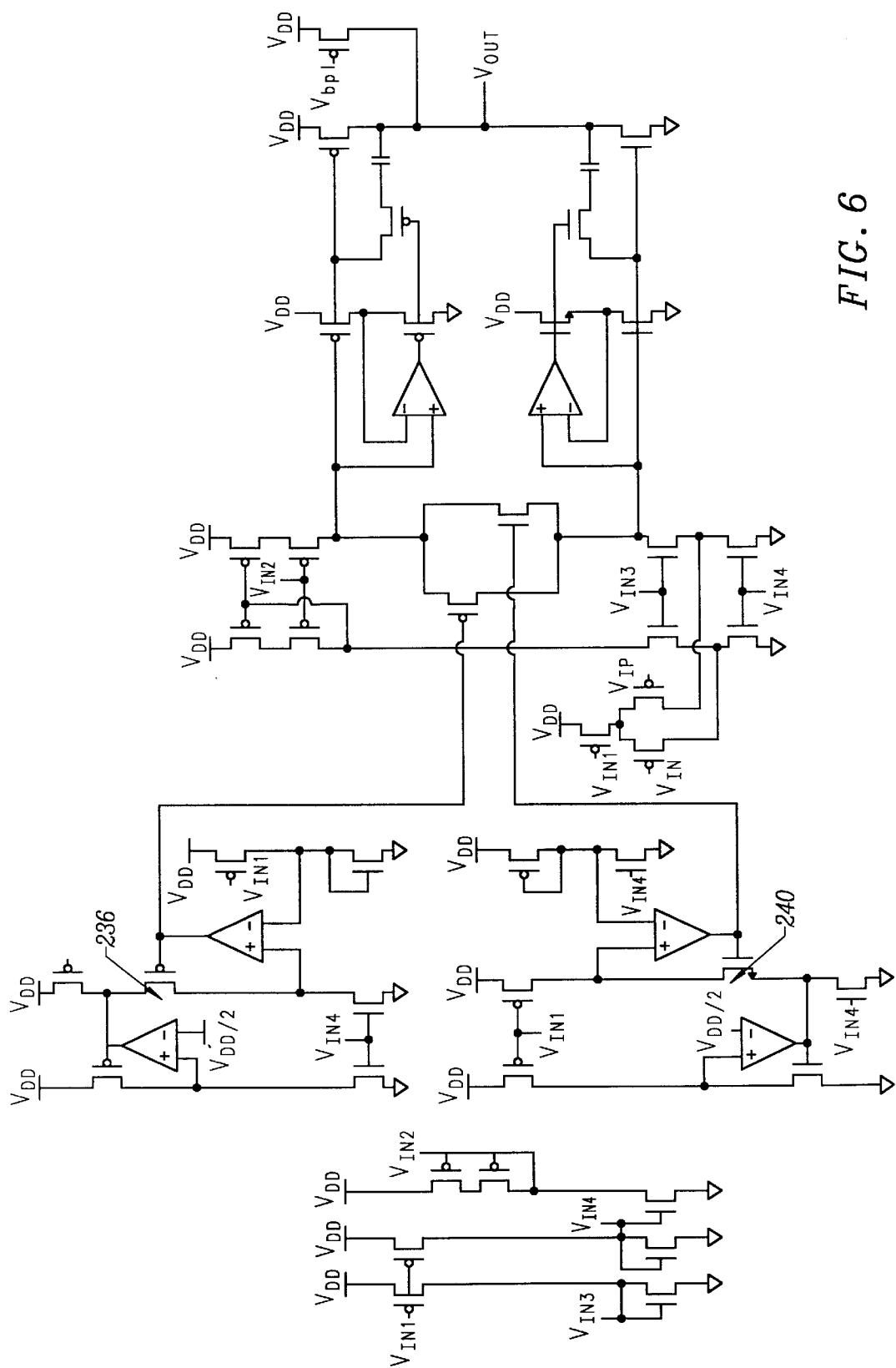
FIG. 6 shows a simplified high-level schematic of a high-frequency high-current line driver according to another embodiment of the present invention.

FIG. 6 shows a simplified high-level schematic of a high-frequency high-current line driver 600 according to another embodiment of the present invention. This schematic is merely an example and should not limit the scope of the claims herein. One of ordinary skill in the art would recognize many other variations, modifications, and alternatives. The input stage operates similarly to that of FIG. 2. The output stage including the compensation circuits of this specific embodiment operates similarly to the output stage and compensation circuits of FIG. 2. The biasing circuit operates similarly to that of FIG. 4.

In conclusion, it can be seen that the present invention provides numerous advantages over the prior art. Principally, the present invention stabilizes the location of the compensation zero due to the compensation circuits. Also the present invention ensures that the translinear loops reliably control the current flow in the output stage. Specific embodiments of the present invention are presented above for purposes of illustration and description. The full description will enable others skilled in the art to best utilize and practice the invention in various embodiments and with various modifications suited to particular uses. After reading and understanding the present disclosure, many modifications, variations, alternatives, and equivalents will be apparent to a person skilled in the art and are intended to be within the scope of this invention. Therefore, it is not intended to be exhaustive or to limit the invention to the specific embodiments described, but is intended to be accorded the widest scope consistent with the principles and novel features disclosed herein, and as defined by the following claims.

What is claimed is:

1. A high-frequency high-current line driver circuit comprising:

an output circuit having a first and a second output transistor configured for sourcing current to and sinking, current from an output node;

an input circuit configured for sourcing current to and sinking current front the output circuit; and a biasing circuit configured for dc biasing the line driver circuit, wherein the output, input, and biasing circuits are configured to couple to voltage sources;

the output circuit further comprising, a compensation circuit having a first and a second compensation transistor, the compensation circuit being configured for tying a transconductance, $g_m$, of the first and second output transistors to a conductance, $g_{ds}$, of the first and second compensation transistors, respectively, such that a $g_m$-to-$g_{ds}$ ratio becomes fixed, wherein the tying stabilizes and prevents movement of a location of a compensation zero, the compensation zero being created by the compensation circuit, wherein the tying for said first output transistor utilizes a first op-amp to bias said first compensation transistor.

2. The compensation circuit of claim 1 further comprising;

first, second, and third transistors, and a first capacitor;

the first op-amp having a non-inverting input coupled to a gate of the first transistor and a gate of the first output transistor, to a source of the third transistor, and to a first node of the input circuit;

the first op-amp having an inverting input coupled to a drain of the first transistor and to a source of the second transistor;

the first op-amp having all output coupled to a gate of the second transistor and a gate of the third transistor;

the third transistor having a drain coupled to a drain of the first output transistor via the first capacitor; and a source of the first transistor being coupled to a $V_{DD}$ source and a drain of the second transistor being coupled to a $V_{SS}$ source.

3. The compensation circuit of claim 2 wherein the first, second, and third transistors are PMOS transistors.

4. The compensation circuit of claim 1 further comprising:

a second op-amp, fourth, fifth, sixth, and seventh transistors, and a second capacitor;

the second op-amp having a non-inverting input coupled to a gate of the fourth transistor and a gate of the second output transistor, to a source of the sixth transistor, and to a second node of the input circuit;

the second op-amp having an inverting input coupled to a drain of the fourth transistor and to a source of the fifth transistor;

the second op-amp having an output coupled to a gate of the fifth transistor and a gate of the sixth transistor;

the sixth transistor having a drain of coupled to a drain of the second output transistor via the second capacitor; and the fifth transistor having a source coupled to a $V_{DD}$ source and the fourth transistor having a source coupled to a $V_{SS}$ source.

5. The compensation circuit of claim 4 wherein the fourth, fifth, sixth, and seventh transistors are NMOS transistors.

6. The driver circuit of claim 1 wherein the output circuit is a class AB output circuit.

7. The driver circuit of claim 1 wherein the input circuit is a differential input cascode circuit.

8. Using with a high-frequency high-current line driver circuit, a circuit comprising:

a compensation circuit comprising a first and a second compensation transistor, the compensation circuit being configured for tying a transconductance, $g_m$, of a first and a second output transistor to a conductance, $g_{ds}$, of the first and second compensation transistors, respectively, such that a $g_m$-to-$g_{ds}$ ratio becomes fixed, wherein the tying stabilizes and prevents movement of a location of a compensation zero, the compensation zero being created by the compensation circuit, wherein the tying for said first output transistor utilizes a first op-amp to bias said first compensation transistor.

9. A method for stabilizing a location of a compensation zero associated with a compensation circuit of a line driver circuit, the method comprising:

sourcing current to and sinking current from an output node, with an output circuit having a first and a second output transistor;

sourcing current to and sinking current from the output circuit, with an input circuit;

dc biasing the line driver circuit, with a biasing circuit;

wherein the output, input, and biasing circuits are configured to couple to voltage sources;

providing frequency compensation to the line driver circuit a compensation circuit having a first and a second compensation transistor, the compensation zero being created by the compensation circuit; and stabilizing the location of the compensation zero by tying a transeonductance, $g_m$, of the first and second output transistors to a conductance, $g_{ds}$, of the first and second compensation transistors, respectively, such that a $g_m$-to-$g_{ds}$ ratio becomes fixed, wherein the tying for said first output transistor utilizes a first op-amp to bias said first compensation transistor.

* * * * *